(12) United States Patent
Gupta et al.

(10) Patent No.: US 10,470,335 B2
(45) Date of Patent: *Nov. 5, 2019

(54) CONFIGURABLE MODULE GUIDES FOR MODULAR ELECTRONIC SYSTEM

(71) Applicant: CISCO TECHNOLOGY, INC., San Jose, CA (US)

(72) Inventors: Rohit Dev Gupta, Bangalore (IN); Prashanth Pavithran, Bengaluru (IN); Viktor Brauer, Nuremberg (DE); Shailesh R. Nayak, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/022,470

(22) Filed: Jun. 28, 2018

(65) Prior Publication Data

US 2019/0059172 A1 Feb. 21, 2019

Related U.S. Application Data

(63) Continuation-in-part of application No. 15/679,763, filed on Aug. 17, 2017, now Pat. No. 10,042,396.

(51) Int. Cl.
*H05K 7/14* (2006.01)
*G06F 1/16* (2006.01)
*G06F 1/18* (2006.01)

(52) U.S. Cl.
CPC ............ *H05K 7/1492* (2013.01); *G06F 1/16* (2013.01); *G06F 1/187* (2013.01); *H05K 7/1461* (2013.01); *H05K 7/1487* (2013.01)

(58) Field of Classification Search
None
See application file for complete search history.

(56) References Cited

U.S. PATENT DOCUMENTS

| | | | |
|---|---|---|---|
| 3,465,891 A | 9/1969 | De Rose | |
| 4,779,744 A | 10/1988 | Shely | |
| 5,426,567 A * | 6/1995 | Opeka | H05K 7/1461 361/736 |
| 5,696,668 A | 12/1997 | Zenitani | |
| 6,008,995 A | 12/1999 | Pusateri | |
| 6,309,237 B1 | 10/2001 | Longueville | |
| 7,099,160 B1 | 8/2006 | Ice | |
| 7,108,559 B2 | 9/2006 | Shtargot et al. | |
| 7,224,588 B2 | 5/2007 | Nieman et al. | |
| 7,277,296 B2 | 10/2007 | Ice | |
| 8,047,383 B2 | 11/2011 | Hendrix | |
| 8,054,619 B1 | 11/2011 | Antosh | |
| 8,184,442 B2 * | 5/2012 | Fujimura | H05K 7/1418 361/756 |

(Continued)

*Primary Examiner* — Xanthia C Cunningham
(74) *Attorney, Agent, or Firm* — Cindy Kaplan

(57) ABSTRACT

In one embodiment, an apparatus includes a frame comprising a top wall, a bottom wall, and sides defining an opening for receiving a plurality of removable electronic modules, a guide slidably insertable into the frame to partition an upper or lower portion of the opening when inserted into the frame, wherein the guide comprises a first edge for slidable engagement with the top wall or the bottom wall, and a lead screw extending from an opening in the guide spaced from a front end of the guide, to a back end of the guide for connecting the guide to the frame.

20 Claims, 16 Drawing Sheets

(56) References Cited

U.S. PATENT DOCUMENTS

| | | |
|---|---|---|
| 8,582,299 B1 | 11/2013 | Phillips |
| 9,326,386 B2 | 4/2016 | Elison |
| 9,456,517 B2 | 9/2016 | Laufer et al. |
| 2002/0006026 A1 | 1/2002 | Takahashi |
| 2002/0131257 A1 | 9/2002 | Agard |
| 2006/0044775 A1 | 3/2006 | Hoshino |
| 2008/0037218 A1 | 2/2008 | Sharma |
| 2008/0055877 A1* | 3/2008 | Berke .................. H05K 7/1487 361/801 |
| 2012/0008292 A1* | 1/2012 | Nichols ................ H05K 7/1461 361/756 |
| 2013/0050955 A1 | 2/2013 | Shinsato |
| 2013/0322028 A1* | 12/2013 | Yu ........................ H05K 7/1461 361/741 |
| 2015/0009639 A1 | 1/2015 | Papakos et al. |
| 2015/0293566 A1 | 10/2015 | Ehlen et al. |
| 2016/0291645 A1 | 10/2016 | Alvarado |
| 2017/0055702 A1 | 3/2017 | Sklansky |

* cited by examiner

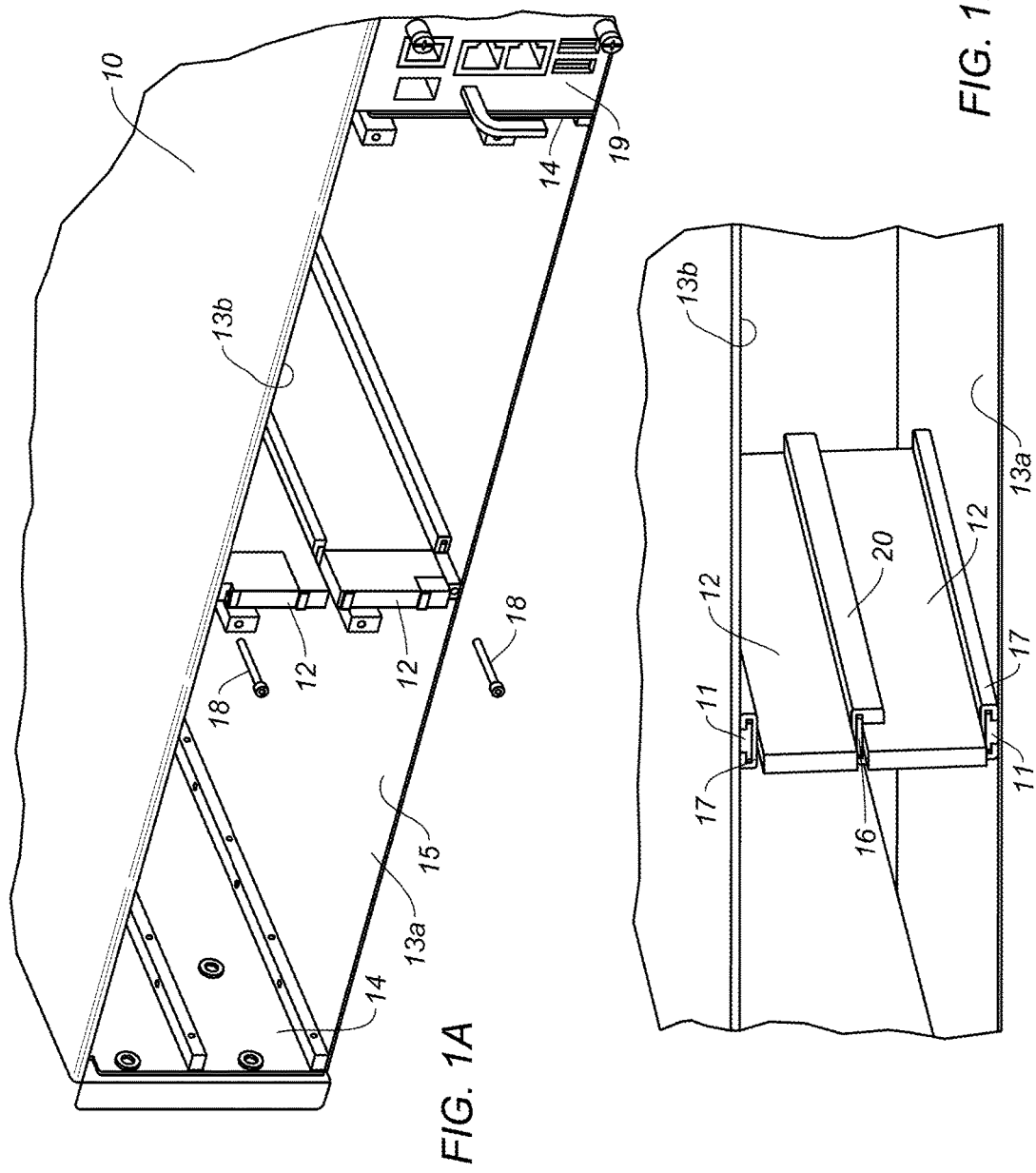

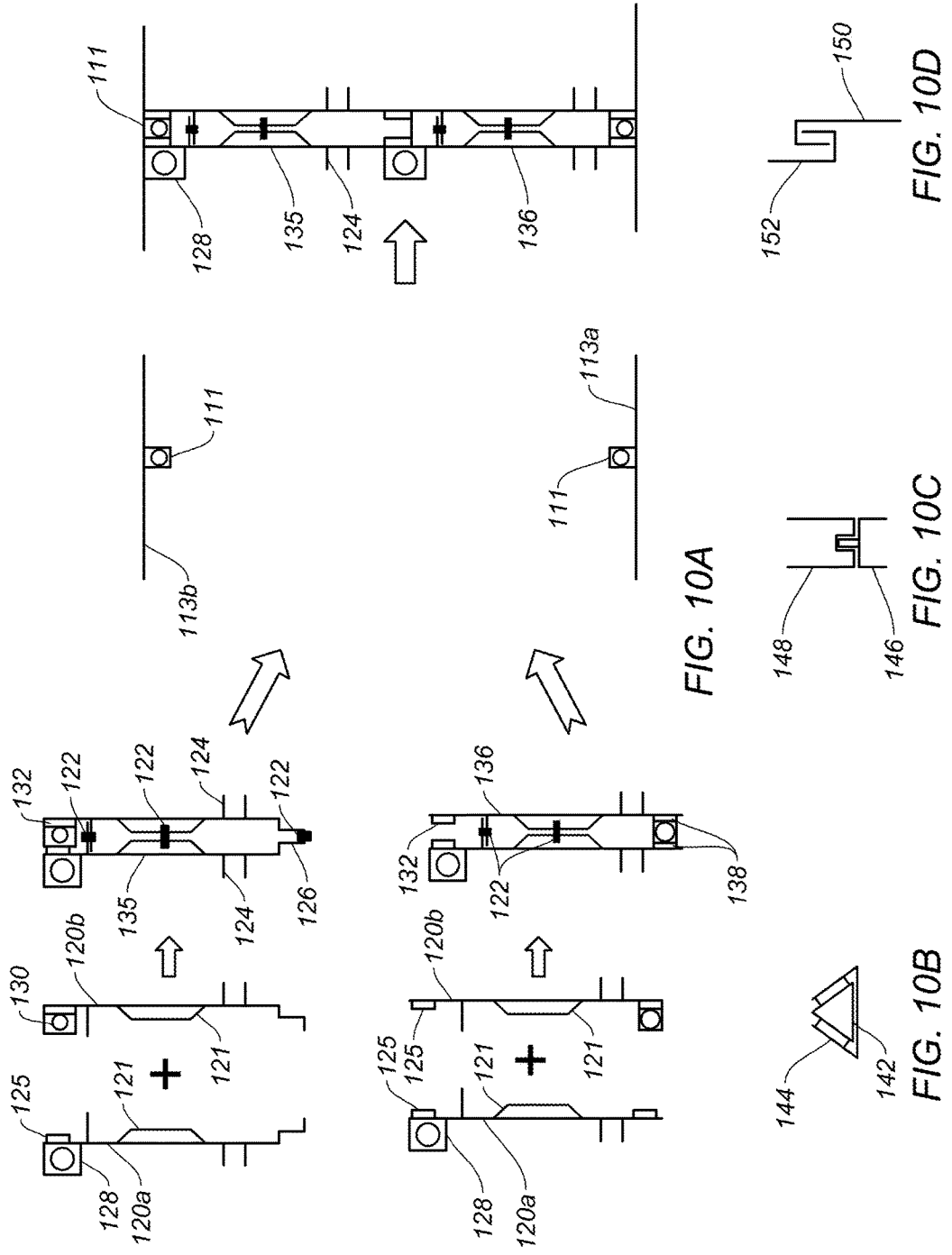

CONFIGURABLE MODULE GUIDES FOR MODULAR ELECTRONIC SYSTEM

STATEMENT OF RELATED APPLICATIONS

The present application is a continuation-in-part of U.S. patent application Ser. No. 15/679,763, entitled CONFIGURABLE MODULE GUIDES FOR MODULAR ELECTRONIC SYSTEM, filed on Aug. 17, 2017. This application is incorporated herein by reference in its entirety.

TECHNICAL FIELD

The present disclosure relates generally to modular electronic systems, and more particularly, configurable module guides for modular electronic systems.

BACKGROUND

Modular electronic systems are designed to provide flexibility to configure systems as per user needs. These systems typically have multiple slots to accommodate a variety of modules (e.g., line cards, service cards, fabric cards, and the like). Conventional modular systems often do not allow for multiple combinations of hardware configurations or future development of field replaceable modules with a different form-factor.

BRIEF DESCRIPTION OF THE DRAWINGS

FIG. 1A is a perspective partial view of a modular electronic system frame with configurable module guides, in accordance with one embodiment.

FIG. 1B is a perspective partial view of the frame and configurable module guides of FIG. 1A with parts removed to show details of sliding engagement of the guides and frame.

FIG. 10A is a front exploded view and assembled view of guides and frame in accordance with another embodiment.

FIG. 10B is a front partial view of sliding engagement of guides, in accordance with one embodiment.

FIG. 10C is a front partial view of sliding engagement of guides, in accordance with another embodiment.

FIG. 10D is a front partial view of sliding engagement of guides, in accordance with yet another embodiment.

Corresponding reference characters indicate corresponding parts throughout the several views of the drawings.

DESCRIPTION OF EXAMPLE EMBODIMENTS

Overview

Figure 2A:
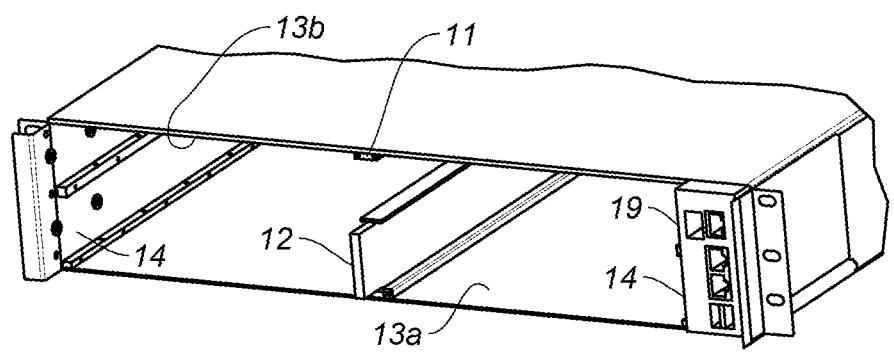
FIG. 2A is a perspective partial view of the frame of FIG. 1B with a top guide removed.

In one embodiment, an apparatus generally comprises a frame comprising a top wall, a bottom wall, and sides defining an opening for receiving a plurality of removable electronic modules, a guide slidably insertable into the frame to partition an upper or lower portion of the opening when inserted into the frame, wherein the guide comprises a first edge for slidable engagement with the top wall or the bottom wall, and a lead screw extending from an opening in the guide spaced from a front end of the guide, to a back end of the guide for connecting the guide to the frame.

In another embodiment, an apparatus generally comprises a frame comprising a top wall, a bottom wall, and sides defining an opening for receiving removable electronic modules, a guide extending longitudinally in the frame and partitioning at least a portion of the opening, wherein the guide is adjacent to one of the top wall and the bottom wall and spaced from the other of the top wall and the bottom wall, and a lead screw extending longitudinally within a groove formed in a side of the guide for attaching the guide to a guide support member connected to at least one of the top wall and the bottom wall.

In yet another embodiment, a modular electronic system generally comprises a frame comprising a top wall, a bottom wall, and sides defining an opening for receiving a plurality of removable electronic modules, at least two guides extending generally parallel with the sides of the frame, each of the guides comprising an edge for slidable engagement with another of the at least two guides, and at least two lead screws for connecting the guides to the frame. The guides partition the opening for receiving the electronic modules and are removable to configure the opening for receiving a different number of the removable electronic modules or different sizes of the removable electronic modules.

Further understanding of the features and advantages of the embodiments described herein may be realized by reference to the remaining portions of the specification and the attached drawings.

Example Embodiments

The following description is presented to enable one of ordinary skill in the art to make and use the embodiments.

Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of removable modules (e.g., service cards, line cards, fabric cards, or other cards, components, or modules). A drawback with conventional systems is that modules (e.g., cards) typically have to be identical in form factor, so that they can be installed in predefined modular slot configurations. This creates a challenge for future growth as next-generation modules may need additional PCBA (Printed Circuit Board Assembly) area for new devices, more front panel space for higher bandwidth interconnects, and more volume for higher power/thermal dissipation. Due to this limitation, modular electronic systems often reach their end of life within a short period of time and new hardware systems need to be developed.

The embodiments described herein provide a mechanical arrangement for modular platforms, which offers flexibility in configuring module (card) guides to accommodate modules of different form-factors. The field-configurable module guide partitioning system provides a stable mechanical structure that can be used for multiple combinations of field-replaceable modules. As described below, the module slots may be converted into multiple slot configurations by removing the module guides independently from one another. In one or more embodiments, the guides are held in place within a frame of the modular electronic system with a long lead screw extending from a front section of the guide to a back end of the guide for connecting the guide to a guide support member attached to the frame.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise a modular electronic system as described herein. The network device may include one or more processor, memory, and network interfaces. One or more of these components may be located in a module (e.g., line card) removably inserted into the network device. The network device may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

One or more embodiments may be used, for example, in high-speed optical transport, DWDM (Dense Wavelength Division Multiplexing), multi-node controller applications, or any other application. As described below, the configurable guide system provides flexibility to accommodate modules for different applications, which may have different hardware requirements, resulting in a different physical form-factor. The variable slot dimensions (width and height) provided by the field configurable module guide partitioning system provides flexibility to accommodate different physical form-factors.

Referring now to the drawings, and first to FIGS. 1A and 1B, a configurable module guide system is shown installed in a chassis frame 10. The configurable module guide system comprises two or more stacked guides (blocks) 12 (e.g., lower (bottom) guide and upper (top) guide). The frame 10 comprises a bottom wall 13a, top wall 13b, and sides 14, which define an opening (slot, cavity, enclosure) 15 for receiving one or more modules. It is to be understood that the terms "top" or "upper" and "bottom" or "lower" as used herein are relative to the installed position of the modular electronic system and may also refer to a left or right wall if the modular electronic system is installed in a vertical rather than horizontal position. The chassis frame 10 may be formed from any suitable material including, for example, aluminum, steel, or any other metal, non-metal, or composite material. The guides (blocks) 12 may also be formed from metal or any other suitable material.

The configurable module guides 12 extend longitudinally from a front edge of the frame 10 towards a rear portion of the frame and may be located at any distance between opposing internal edges 14 of the frame. For example, as shown in FIGS. 1A and 1B, the guides 12 are located parallel to the sides and generally equidistant from each of the internal edges 14 of the frame. The guides 12 may also be positioned at a different distance from each side 14 to provide openings for receiving different width line cards or additional guides may be included to provide further partitioning of the opening 15. As described below, the guides 12 are inserted at the location of the corresponding rails 11.

In the example shown in FIG. 1A, a module (e.g., processor card, controller card) 19 is inserted between an outer edge of the frame and side 14 defining the enclosure 15. As described below, the frame 10 may be configured to receive any number of modules in addition to the modules (cards) received in opening 15 formed by internal sides 14, bottom wall 13a, and top wall 13b.

In the example shown in FIGS. 1A and 1B, the opening 15 is partitioned (divided) by the guides 12 to form two openings (slots, cavities), each defining one or more slots for receiving one or two independent modules. As described in detail below, one (i.e., bottom or top) or both (i.e., bottom and top) guides 12 may be removed from the frame 10 to form different shape and size slots within the opening 15 defined by the bottom and top walls 13a, 13b and sides 14 of the frame 10.

As shown in FIG. 1B, each guide 12 is slidably received on rails 11 connected to (e.g., integral with or attached to) the frame 10 and slidably connected to one another. In the example of FIG. 1B, each of the configurable module guides 12 independently slide over one another and over slide rail features 11 on inner surfaces of the bottom wall 13a and top wall 13b. In one embodiment, each guide 12 includes a U-shaped channel 17 on a first (outer) edge, which is configured to slide over the rail 11 on the bottom or top wall 13a, 13b of the frame 10.

In one embodiment, the bottom guide 12 includes a longitudinal flange 16 on a second (inner) edge, which is slidably received in a channel 20 on a second (inner) edge of the top guide. It is to be understood that the sliding interfaces described herein are only examples and that other configurations may be used without departing from the scope of the embodiments. Also, if the system includes more than two configurable guides 12 (e.g., for taller frames configured to receive more modules or modules with a larger height), guides interposed between the top and bottom guides would have edges suitable for interface with adjacent guides (e.g., flange 16 on one longitudinal edge and channel 20 on other longitudinal edge).

In the embodiment shown in FIG. 1A, the guides 12 are held in place by fasteners 18 extending through the guides 12 and frame 10, as described further below with respect to FIG. 11A. As described below with respect to FIGS. 12-16, the guides may also be attached to the frame with a long lead screw.

Figure 2B:
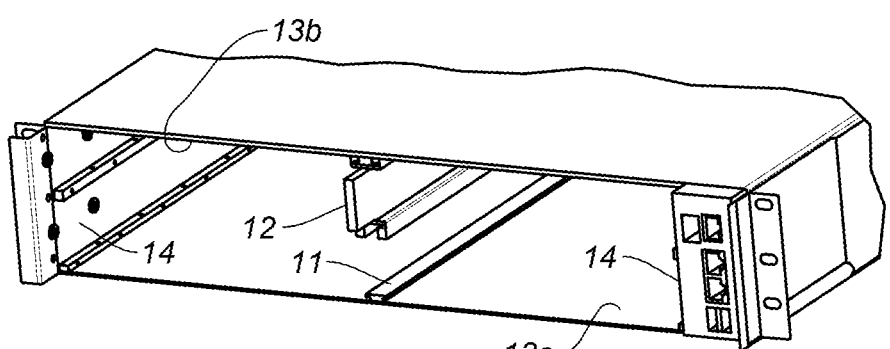
FIG. 2B is a perspective partial view of the frame of FIG. 1B with a bottom guide removed.
Figure 2C:
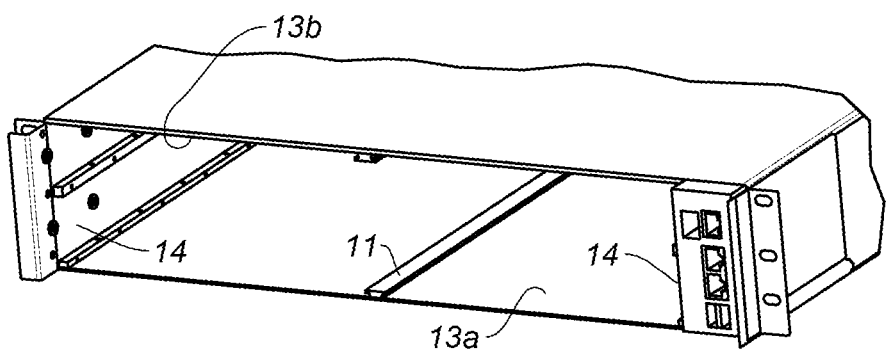
FIG. 2C is a perspective partial view of the frame of FIG. 1B with the top and bottom guides removed.
Figure 7:
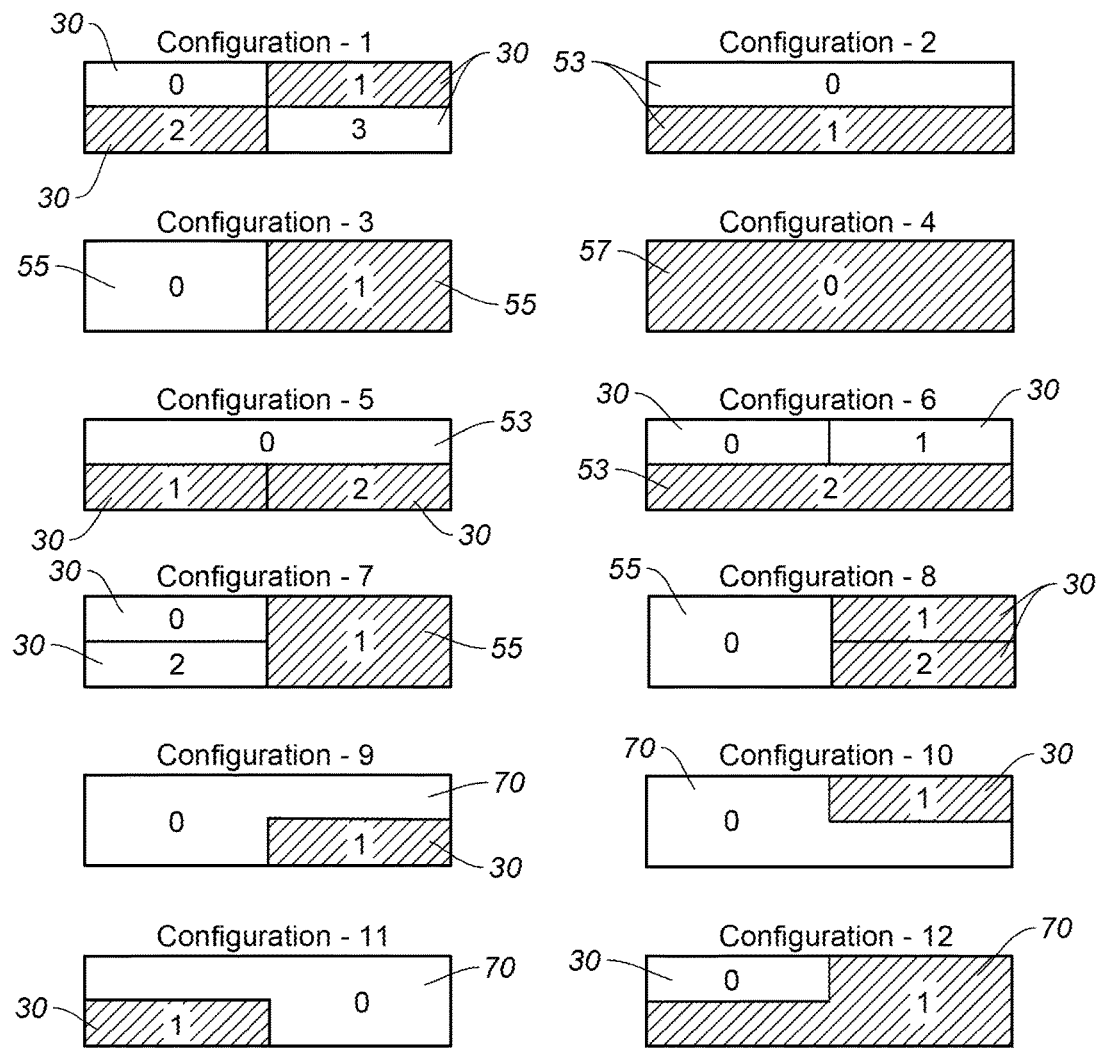
FIG. 7 schematically illustrates different module configurations that may be installed with the configurable module guides.

As shown in FIGS. 2A, 2B, and 2C, one or both of the guides 12 may be independently removed from the frame 10 to configure the modular electronic system for receiving various numbers or sizes of modules. FIG. 2A shows the bottom guide 12 installed with the top guide removed. Once the top guide is removed, a full-width module may be installed in the upper portion of the frame 10 with two half-width modules installed in the lower portion of the frame. FIG. 2B shows the bottom guide 12 removed to allow for a full-width module to be installed in the lower portion of the frame. FIG. 2C shows both guides 12 removed to allow for a full-width, full-height module or two full width, half-height modules to be installed in the frame. A half-width, full-height module may also be installed with both guides 12 in place. Also, an L-shaped module may be installed along with a half-width, half-height module with one guide 12 installed, as shown in FIG. 7 and described below.

It is to be understood that terms herein referring to width (or wide) and height (or high) are relative to the orientation of the modular electronic system shown in the Figures and may also refer to corresponding dimensions if the modular electronic system is installed vertically rather than horizontally. In one or more embodiments, the width of the line card is greater than the height of the line card. Also, the terms "half" or "full" as used herein are relative to the number of guides 12 installed in the frame 10 and the height of the frame. For example, if the frame is configured to receive three stacked guides, a line card that is referred to herein as half-height may be one-third height and a line card referred to herein as full-height may be two-thirds height.

Figure 3:
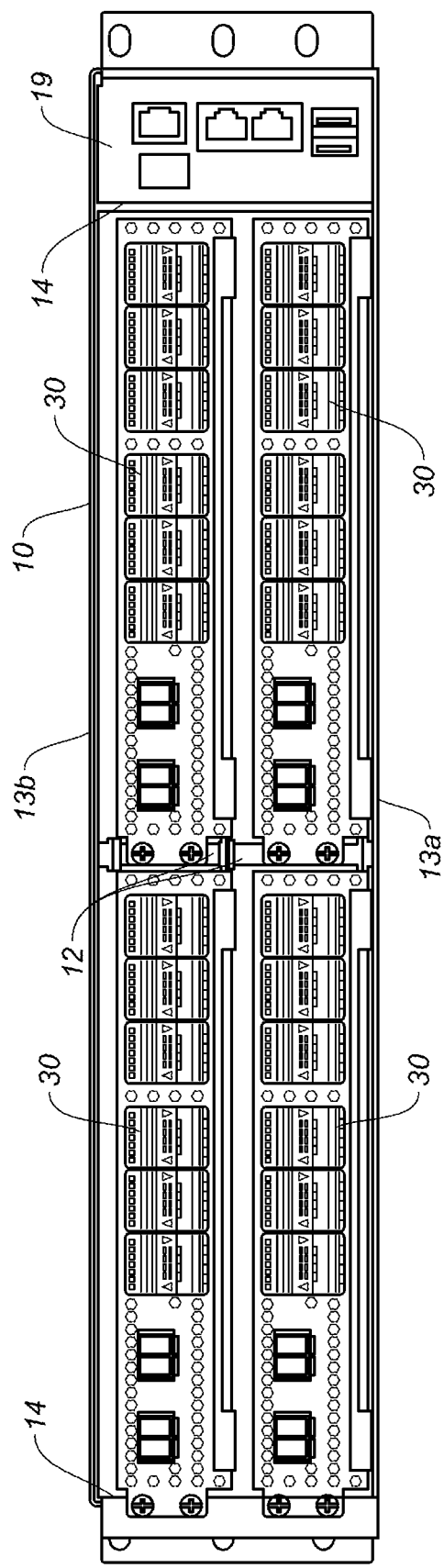
FIG. 3 is a front view of the frame and guides of FIG. 1A with modules installed.

FIG. 3 is a front view of a modular electronic system with four half-width, half-height independent line cards 30 installed along with one controller card 19. The modular electronic system may operate, for example, as a switch, router, server, or any other network device comprising modules (components, cards, trays, elements) included in modular sections. The modules 19, 30 and guides 12 are slidably removable from the frame 10. The line cards 30 and controller card 19 may comprise any number of interfaces or components, as is well known by those skilled in the art. The line card 30 may comprise, for example, a printed circuit board assembly. As previously noted and described in detail below, one or more guides 12 may be removed to allow for different form-factor modules. Also, with both guides 12 installed, a half-width, full height line card may be installed in one or both openings (slots) formed by the guides 12, walls 13a, 13b, and sides 14. Thus, different height modules may be installed without removing the guides 12.

Figure 4A:
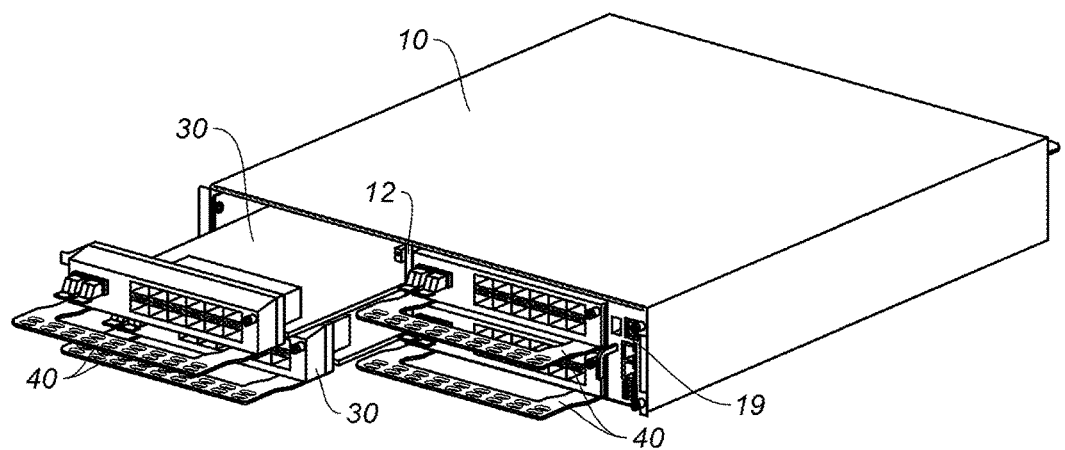
FIG. 4A is a front perspective of the modular electronic system of FIG. 3.
Figure 4B:
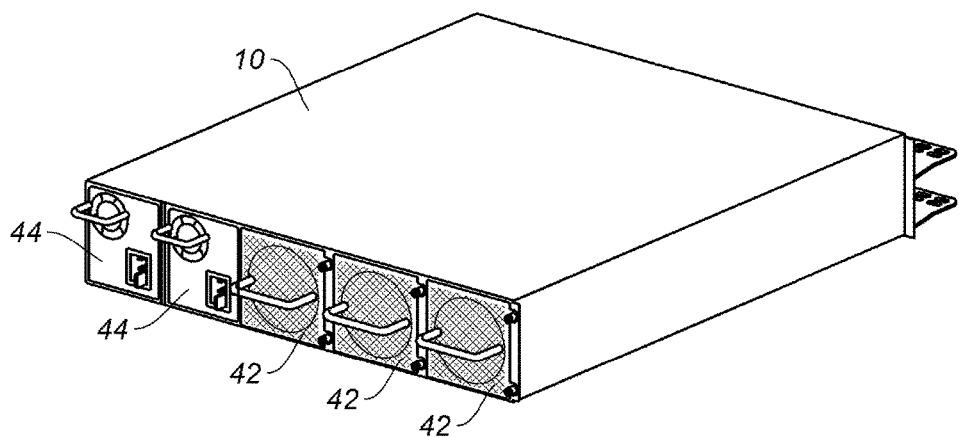
FIG. 4B is a rear perspective of the modular electronic system of FIG. 3.

FIGS. 4A and 4B are front and rear perspective views of the modular electronic system shown in FIG. 3. In this example, the system includes two guides 12 installed in the frame 10 configured for receiving four line cards 30. The controller card 19 is also installed in a front of the system. The system may include one or more doors 40 movable between an open position (as shown in FIG. 4A) for installing or removing the line cards 30 and a closed position, in which the doors 40 at least partially cover the line cards. As shown in FIG. 4B, the modular electronic system in this example further includes three modular fan trays 42 for circulating air throughout the chassis and preventing the cards 30 from overheating, and two modular power supply units 44.

It is to be understood that the configuration shown in FIGS. 3, 4A, and 4B is only an example and that the modular electronic system may be configured for receiving any number or type of modules, including, for example, power components, air outlet, air inlet, fan trays, fiber management components, cards (e.g., fabric card, line card, service card, combo card, controller card, processor card, high density line card, high power line card, high density and power line card). The electronic modular system may include any type, number, shape, size, or arrangement of components and modules, without departing from the scope of the embodiments. Also, the modular electronic system may be configured with any number, size, shape, or arrangement of guides 12.

Figure 5:
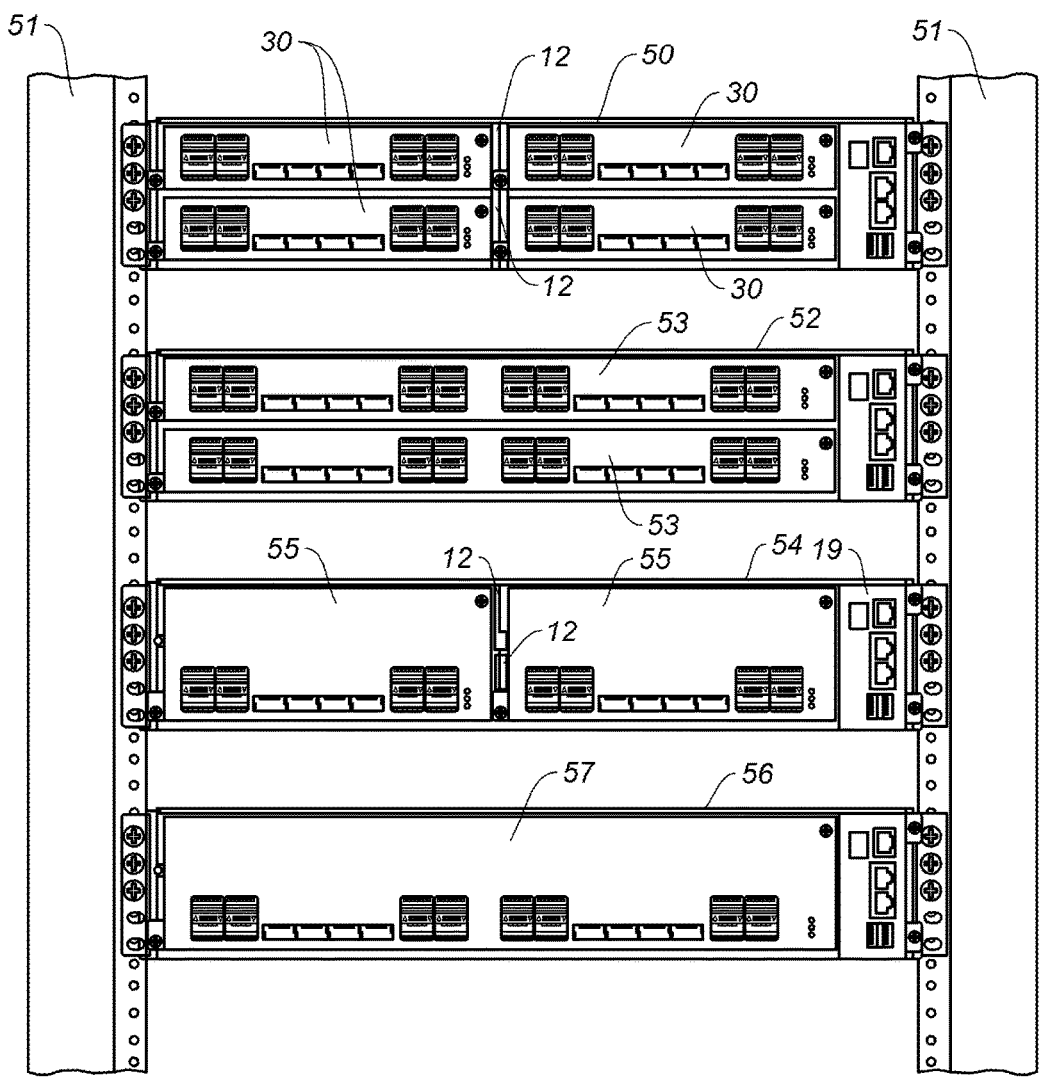
FIG. 5 is a front view showing different configurations of the guides and modules in modular electronic systems mounted in a rack mounting system.

In one embodiment, the modular electronic system is mounted in a rack mounting system (e.g., two or four post rack mounting system with slider brackets). FIG. 5 is a front view of a rack mounting system with four modular electronic systems mounted on brackets 51. In this example, the top system 50 comprises two guides 12 configured to hold four line cards 30, the second system 52 (moving downward) has both guides removed and includes two full-width, half-height line cards 53. The third system 54 has two guides 12 installed and includes two half-width, full-height line cards 55. The bottom system 56 has no guides installed and comprises one full-width, full-height line card 57.

Figure 6:
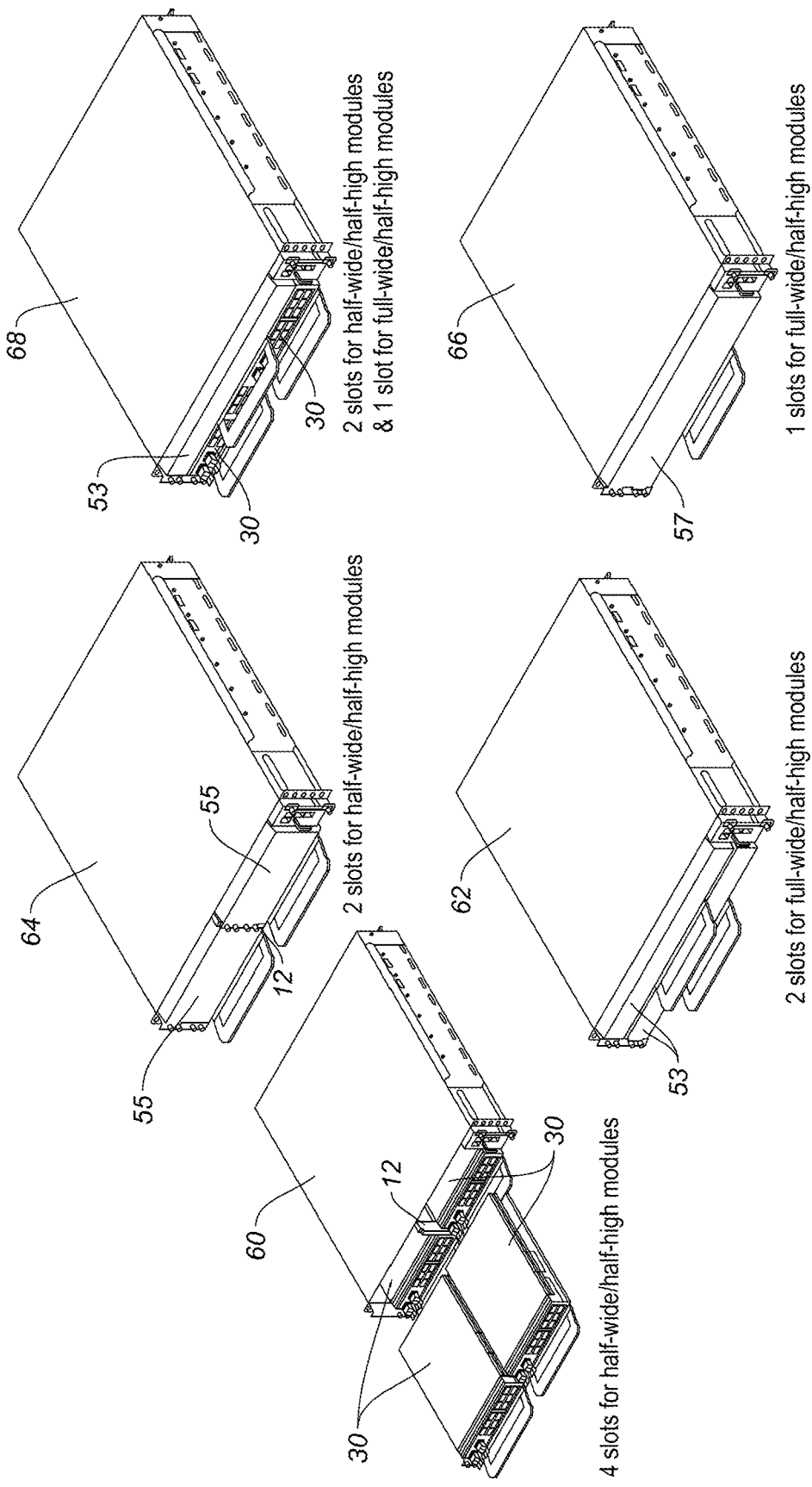
FIG. 6 shows perspective views of modular electronic systems with different configurations of guides and modules.

FIG. 6 shows different configurations of modular electronic systems with configurable module guides 12. A first system 60 comprises two guides 12 with four half-width, half-height cards 30 (corresponding to system 50 in FIG. 5). System 62 has no guides installed and holds two full-width, half-height line cards 53 (corresponding to system 52 in FIG. 5). System 64 includes two guides 12 and two half-width, full-height line cards 55 (corresponding to system 54 in FIG. 5). System 66 has no guides installed and holds one full-width, full-height line card 57 (corresponding to system 56 in FIG. 5). System 68 has one guide 12, two half-width, half-height line cards 30, and a full-width, half-height line card 53.

FIG. 7 schematically illustrates various configurations that may be formed with the two removable module guides 12 and different shape and size modules (labeled 0, 1, 2, 3). Configurations 1, 2, 3, 4, and 5 in FIG. 7 correspond to systems 60, 62, 64, 66, and 68 in FIG. 6, respectively. Configuration 6 is similar to configuration 5, expect that the full-width module 53 is on the bottom and the half-width modules 30 are on top. Configuration 5 has a guide 12 on the lower portion, whereas configuration 6 has the guide on the upper portion. Configurations 7 and 8 include two guides for supporting one half-width, full-height module 55 and two half-width, half-height modules 30. Configurations 9, 10, 11, and 12 each include one half-width, half-height module 30 and one irregular shaped (L-shaped) module 70.

In one example, module 70 may comprise a line card on one side (generally corresponding in shape to a standard half-height, half-width line card) attached to a heat sink. The L-shaped form factor of module 70 provides an optimized volume for high power components to provide a bigger heat sink and also provides additional front panel area to add interconnects that can offer higher system bandwidth. These non-standard modules 70, when used with standard modules 30 offer a unique combination of system functionality.

It is to be understood that the configurable module guide system described herein and the configurations shown in FIGS. 1A-7 are only examples and that the system may be scaled up to different sizes and types of hardware platforms and comprise any number of guides 12, without departing from the scope of the embodiments. For example, three or more guides may be stacked within an opening to provide a wide variety of configurations for various module form-factors or combinations of modules. Also, there may be two or more rows of stacked guides placed parallel to one another to further partition the opening for receiving different width line cards.

Figure 8:
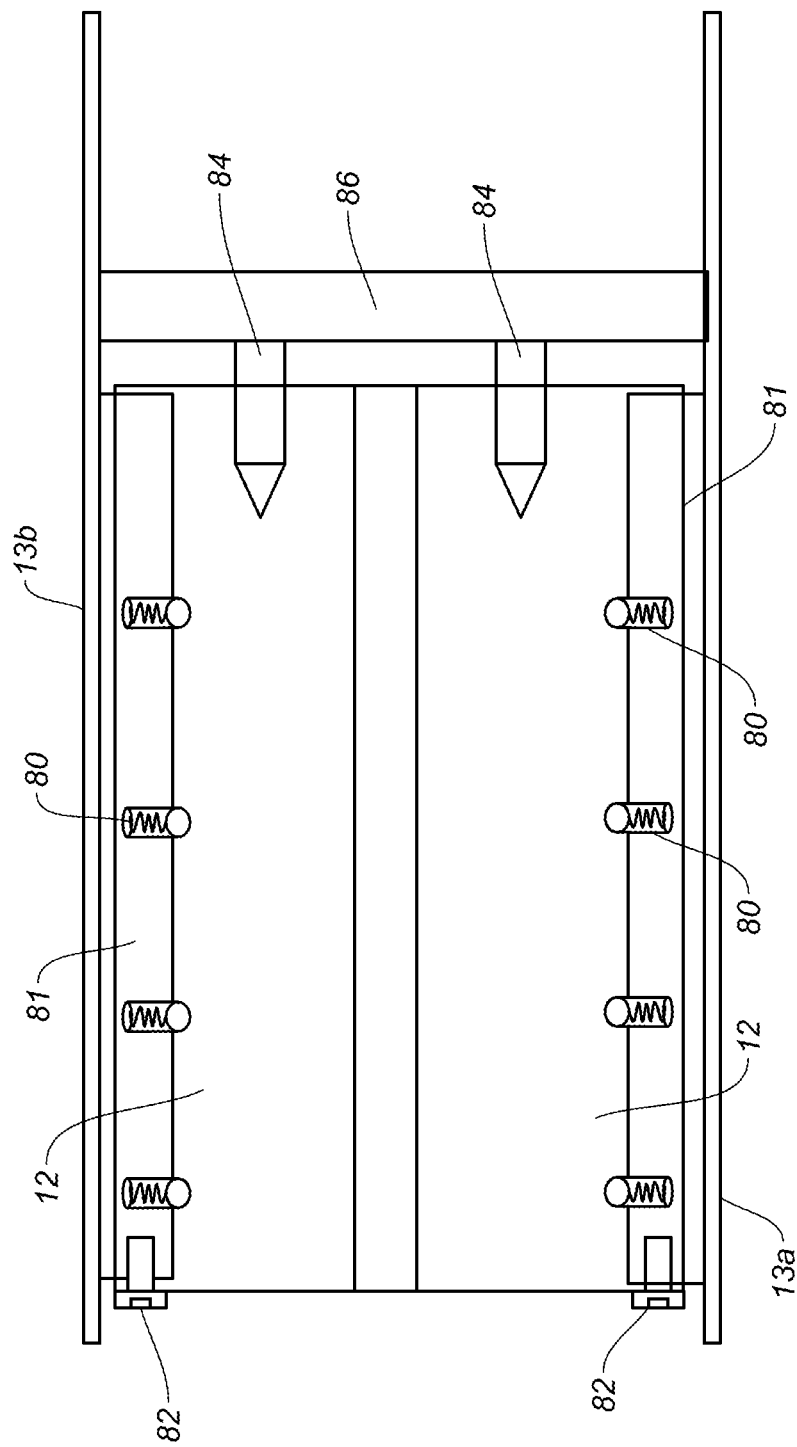
FIG. 8 is a cross-sectional side view of the configurable module guides and frame shown in FIG. 1A with a detent mechanism, in accordance with one embodiment.

FIG. 8 is a cross-sectional side view of the guides 12 in frame 10. In one embodiment, the guides 12 are easily removed upon removing captive screws 82 at a front portion of the frame. The captive screws 82 are fastened on the fixed rails 81 attached to the bottom and top 13a, 13b of the frame 10. As described in detail below with respect to FIGS. 11A and 11B, the screws 82 may be designed with safety features to prevent unintended removal of the guides 12 or removal of the guides while the line cards are installed.

In one or more embodiments, mechanical guide pins 84 are attached to a vertical support column 86 extending between the lower and upper portions 13a, 13b of the frame 10. The guides 12 are aligned and supported by the index pins 84, which provide stability to the structure during extreme conditions of shock and vibration.

In one embodiment, each of the guides 12 is configured to interface with a detent mechanism comprising one or more detents 80 located on rails 81 on the lower and/or upper portions of the frame 10. The detents 80 provide positive contact between the guide 12 and frame 10 and maintain consistent insertion and extraction forces. They may also be used for indexing to ensure that the guides 12 are assembled properly within the frame 10 and relative to one another. In one or more embodiments, the detent 80 provides a spring force to provide mechanical stability and also compensate for minor tolerance variations.

Figure 9:
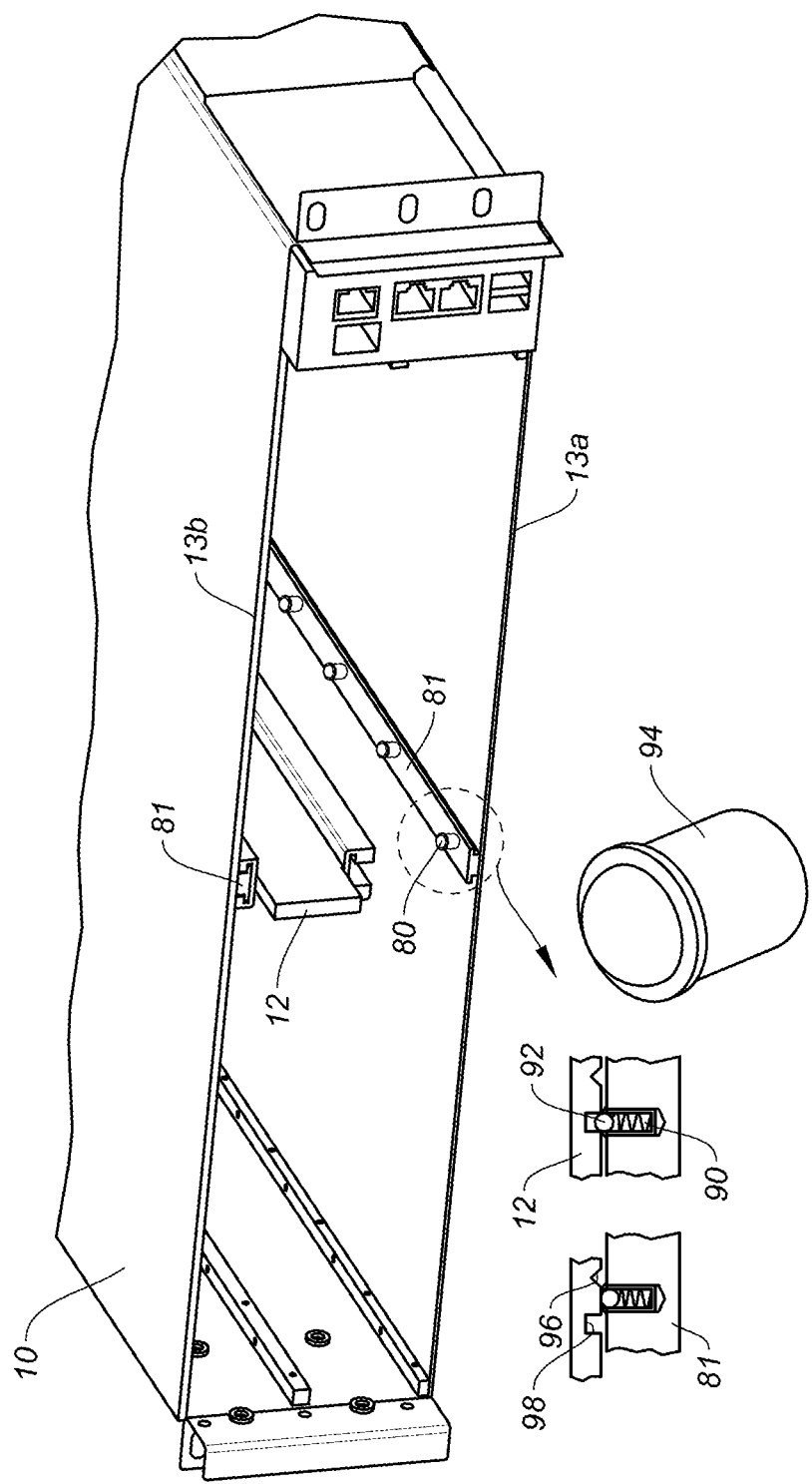
FIG. 9 is a perspective partial view of the frame and guide of FIG. 2B with an exploded view showing details of the detent mechanism, in accordance with one embodiment.

FIG. 9 illustrates additional details of one embodiment of a detent mechanism. The detent 80 comprises a spring 90 and ball 92 forming a plunger retained in a housing 94. The spring loaded ball 92 automatically depresses to allow for adjustments. The guide 12 comprises corresponding ramped grooves 96. When the groove 96 slides over the detent as the guide 12 slides relative to the frame 10 and rail 81, the spring loaded ball 92 snaps into the groove. A last groove 98 on the guide 12 may be formed in a different cross-sectional shape, as shown in the exploded view in FIG. 9, to provide an indexing feature to snap the guide into its proper alignment and position. The force of the detent 80 is easily overcome with a small force when the guide 12 is removed from the frame 10.

FIG. 10A illustrates a guide and frame assembly, in accordance with another embodiment. As described above with respect to FIGS. 1A and 1B, the embodiment comprises two removable guides slidably engaged with one another and a frame. As shown in the assembled view (right portion of FIG. 10A), two guides 135, 136 are slidably engaged with lower and upper walls 113a, 113b of a frame in a modular electronic system. Each guide 135, 136 comprises two mating members 120a, 120b (shown in the exploded view on the left portion of FIG. 10A). The two members 120a, 120b are connected to create the guide 135, 136. In one example, each member is formed from a low cost material (e.g., sheet-metal, plastic, composite, or any other material). In one or more embodiments, an inner portion of each member 120a, 120b comprises an inwardly facing rib 121. In the example shown in FIG. 10A, the members are riveted together (or connected by other suitable means) at three (or fewer or more) locations including the ribs 121 and upper and lower portions, as indicated at 122. Each member 120a, 120b further comprises outwardly extending fingers 124 providing a groove for interface with line cards or other modules.

An upper portion of the top guide 135 and a lower portion of the bottom guide 136 are shaped to define fingers 138 forming a channel 132 for receiving a flange 111 extending from the walls 113a, 113b of the frame for sliding engagement therewith. An opposite end of one of the guides (bottom guide 136 in the example of FIG. 10A) also comprises fingers forming a channel 132 for receiving a mating portion 126 of the other guide (top guide in FIG. 10A). The channel 132 on the upper and lower portions of the guides 135, 136 is located behind the mounting block 130 configured to mate with mounting block on the flange 111 for receiving a connector (e.g., screw), as described below with respect to FIG. 11A. A mounting block 128 is also provided for the line cards. The guides 135, 136 and rails 111 extend longitudinally reward in the opening formed in the frame, as previously described with respect to FIGS. 1A and 1B. As described above, there may be any number of stacked guides located at any position within the frame to partition the opening for receiving any number, shape, size, or combination of modules.

In one embodiment, one or more EMI finger (gasket, foam) 125 may be attached to one or more members 120a, 120b to help with conductive contact between parts and to ensure proper sliding friction between parts.

There are multiple configurations that may be used for sliding engagement between the guides 135, 136 and between the guides and frame. FIGS. 10B, 10C, and 10D illustrate a few examples. In FIG. 10B one end of a member 142 has a generally triangle shaped cross-section and is configured to slidably engage with a corresponding shaped grove 144. In FIG. 10C, one end of the member 148 comprises a narrow channel for receiving a finger extending from an end of a mating member 146. In the example shown in FIG. 10D, generally u-shaped members 150, 152, slidably engage with one another.

It is to be understood that the shapes, sizes, cross-sections, and arrangement of the guides, and guides and frames shown in FIGS. 10A-10D are only examples and that other configurations may be used without departing from the scope of the embodiments.

Figure 11A:
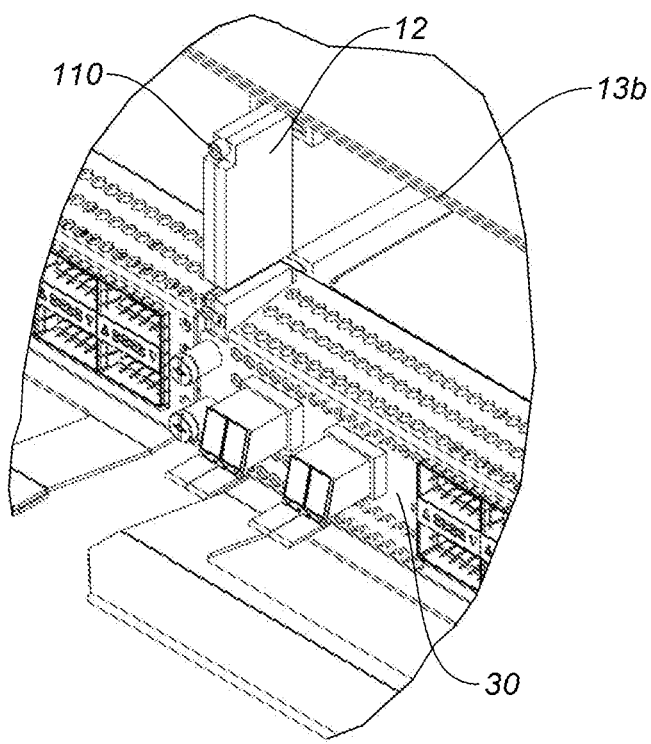
FIG. 11A is a perspective partial view illustrating guide fasteners, in accordance with one embodiment.
Figure 11B:
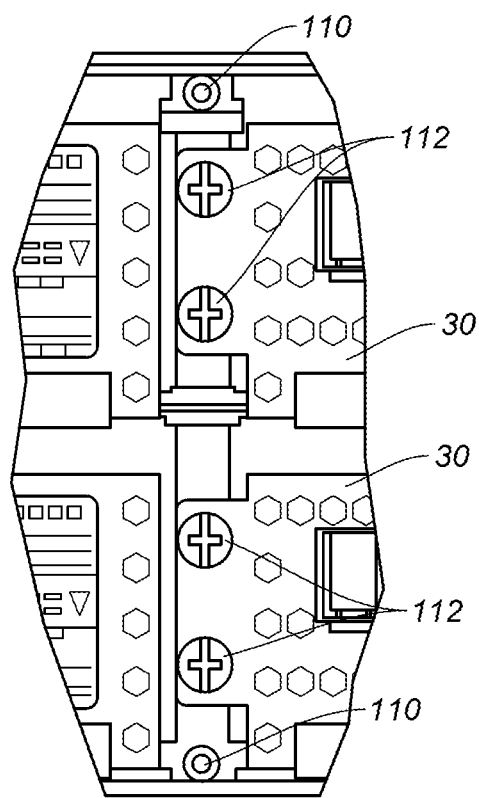
FIG. 11B is a front view illustrating module fasteners, in accordance with one embodiment.

FIGS. 11A and 11B illustrate one embodiment of fastening screws for the guides 12 and modules 30, respectively. The guides 12 may be retained in the frame 10 with fasteners (e.g., captive screws) 110 (FIG. 11A) and the line cards 30 connected to the guides 12 with fasteners (e.g., screws) 112 (FIG. 11B). The screws 110 are inserted into openings in the guides 12 and rails 11 (FIGS. 1A and 11A). The screws 112 are inserted into openings on the line cards 30 and guides 12. In one embodiment, the heads of the guide screws 110 are shaped differently from the line card screws 112 so that a different tool is needed to remove the guides 12, thereby preventing inadvertent removal of the guides. Also, the screws 110 may be positioned such that they are not accessible with the line cards 30 installed. As described below, the guides may also be attached to the frame at a back end of the guide with a long lead screw extending from a front section of the guide.

FIGS. 12-16 illustrate another embodiment of the configurable guides and the modular electronic system. As previously described, the configurable module guide system comprises two or more stacked guides (blocks) 212 (e.g., lower (bottom) guide and upper (top) guide). The frame 210 comprises a bottom wall 213, top wall (removed to show detail), and sides 214, which define an opening (slot, cavity, enclosure) 215 for receiving one or more modules.

Figure 12:
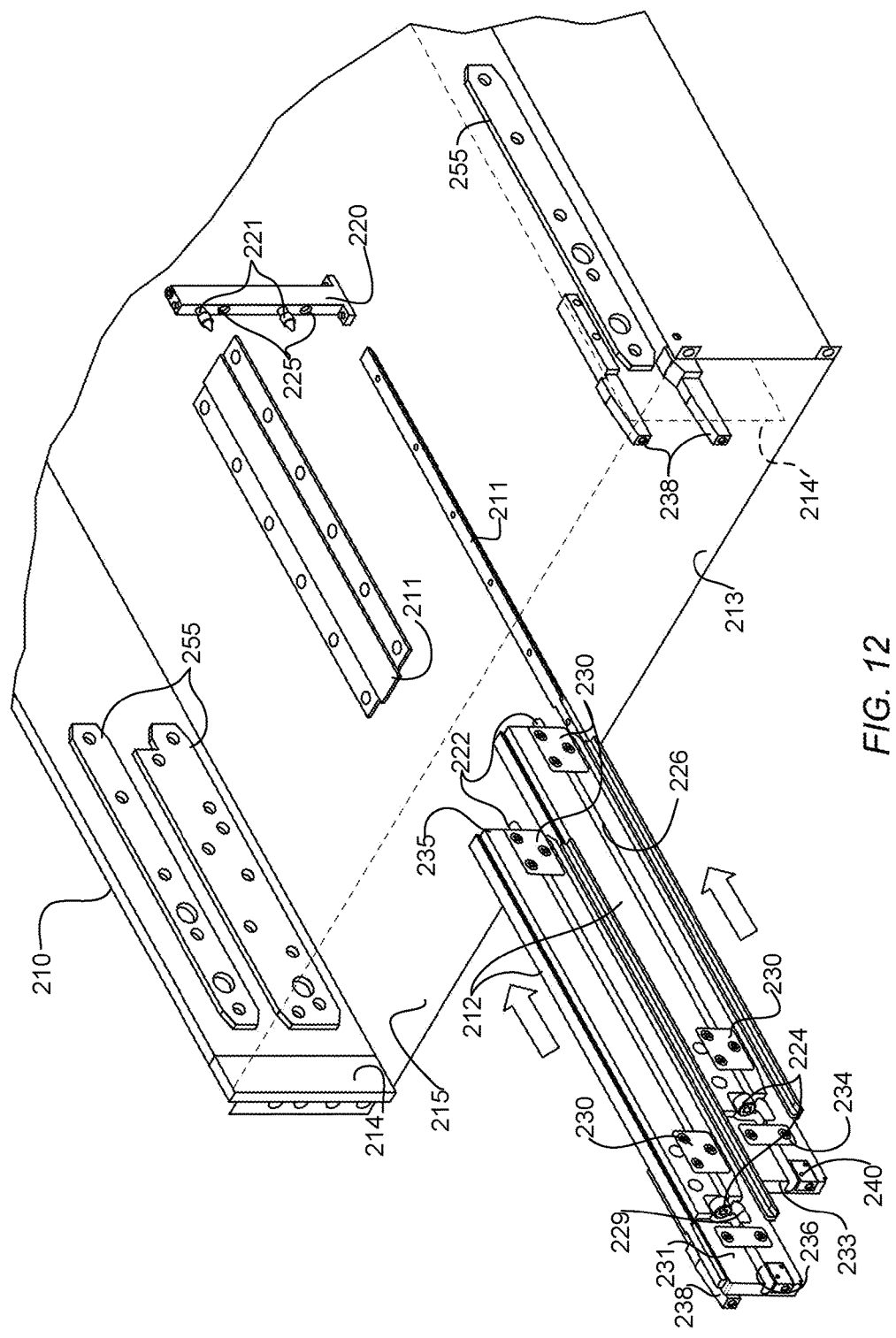
FIG. 12 is a perspective of the modular electronic system with configurable guides and lead screws for use in connecting the guides to the frame, with the guides shown removed from the frame and a top wall removed to show detail.
Figure 13:
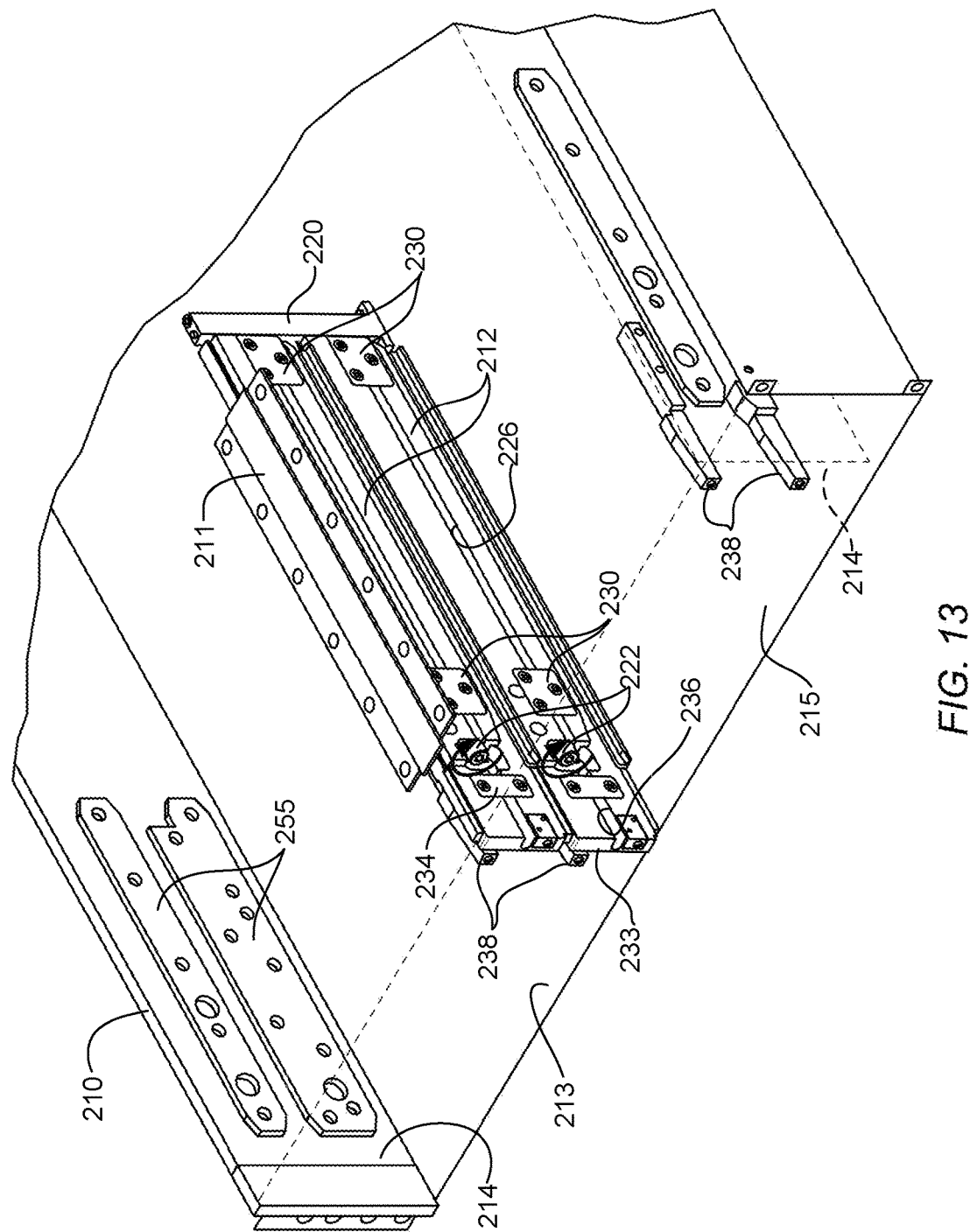
FIG. 13 is a perspective of the modular electronic system shown in FIG. 12 with the guides inserted.
Figure 14:
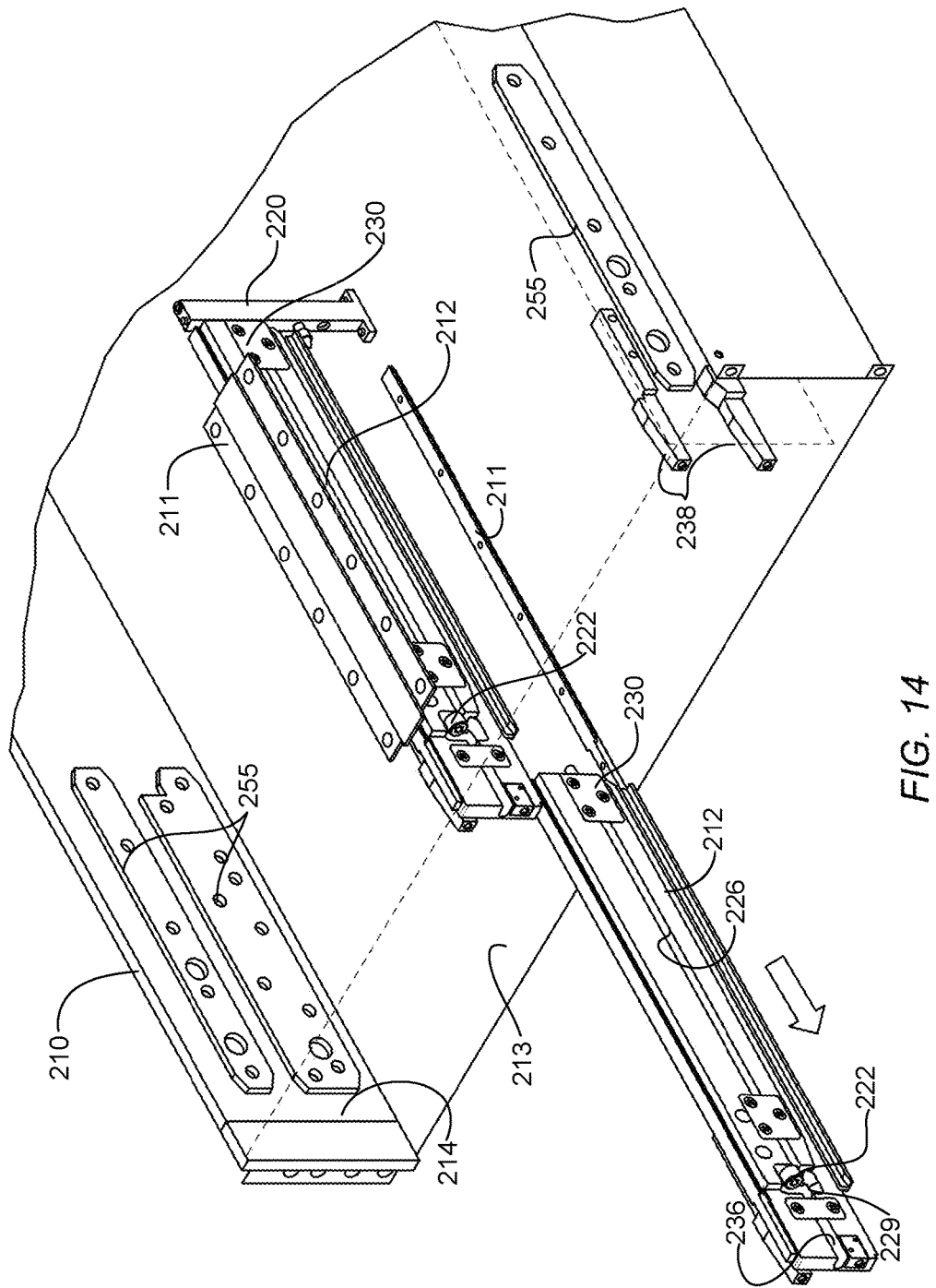
FIG. 14 is a perspective of the modular electronic system shown in FIG. 13 illustrating removal of a lower guide.
Figure 15:
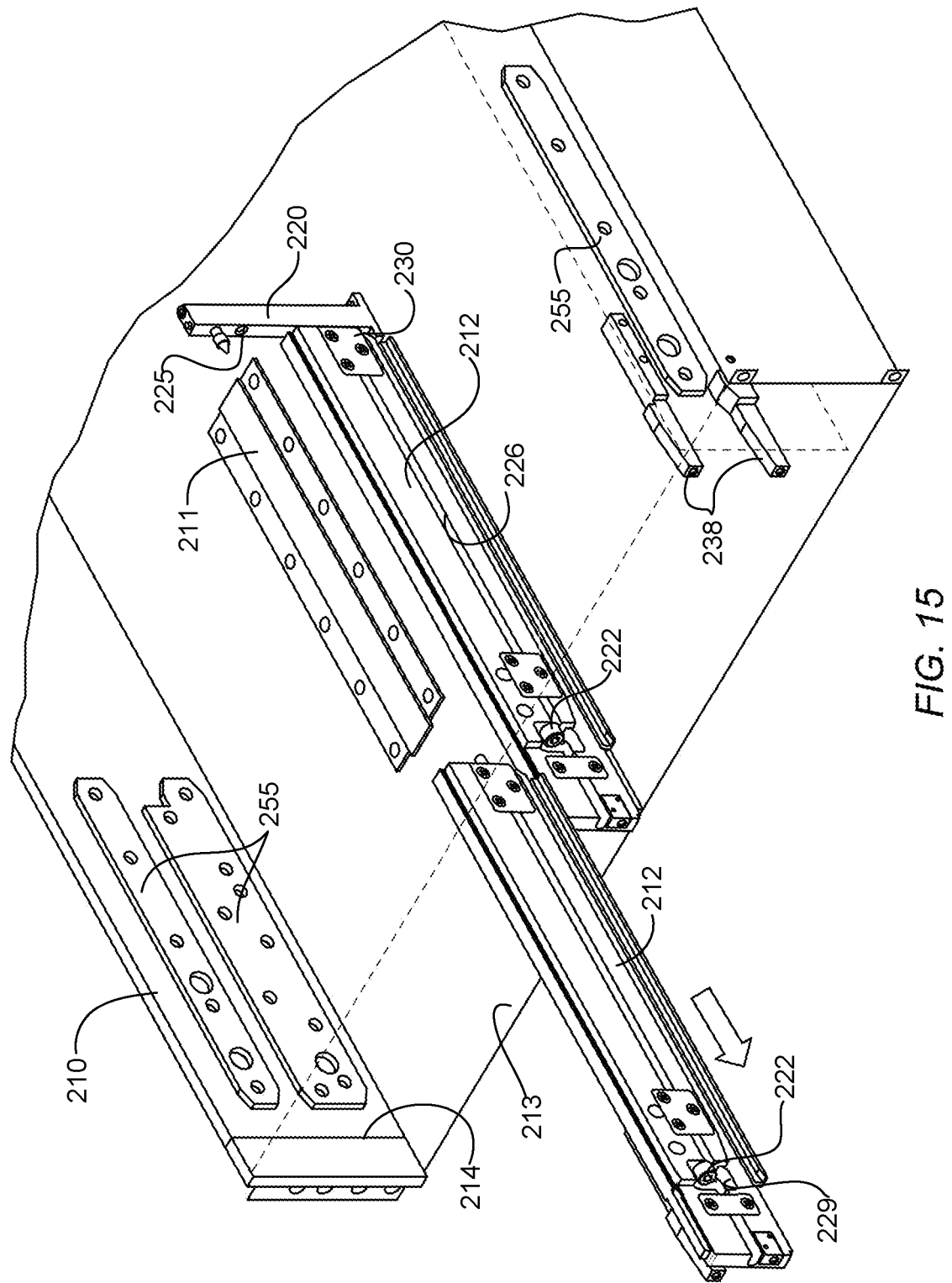
FIG. 15 is a perspective of the modular electronic system shown in FIG. 13 illustrating removal of an upper guide.

FIG. 12 illustrates the guides 212 being inserted into the frame (in the direction indicated by arrows in FIG. 12). FIG. 13 shows the guides 212 in position within the frame with lead screws 222 attached to guide support member 220. FIG. 14 illustrates removal of the bottom guide 212 and FIG. 15 illustrates removal of the top guide in the direction indicated by arrows in FIGS. 14 and 15.

The configurable module guides 212 extend longitudinally from a front edge of the frame 210 towards a rear portion of the frame (e.g., central portion or closer to a back wall of the frame) at which a back end of modules inserted into the front opening 215 of the frame 210 generally reach, and may be located at any distance between opposing internal edges 214 of the frame. In the example shown in FIG. 12, the guides 212 are located parallel to the sides and generally equidistant from each of the internal walls 214 of the frame. The guides 212 may also be positioned at a different distance from each side 214 to provide openings for receiving different width line cards or additional guides may be included to provide further partitioning of the opening 215. The guides 212 are inserted at the location of corresponding rails 211 located along the bottom wall, top wall, or both bottom and top walls. The guides 212 may be formed from aluminum or any other suitable material.

In the example shown in FIG. 13, the opening 215 is partitioned (divided) by the guides 212 to form two openings (slots, cavities), each defining one or more slots for receiving one or two independent modules. As previously described, one (i.e., bottom or top) or both (i.e., bottom and top) guides 12 may be removed from the frame 10 to form different shape and size slots within the opening 215 defined by the bottom wall 213, top wall (not shown) and sides 214 of the frame 210. Each guide 212 is slidably received on the rails 211 connected to (e.g., integral with or attached to) the frame 210 and slidably connected to one another. For example, each of the configurable module guides 212 may slide independently over one another and over slide rail features 211 on inner surfaces of the bottom wall and top wall (or one of the bottom and top walls).

Each internal side wall 214 may further include one or more guide rails 255 to provide sliding engagement with a removable module. The guides 255 are configured so that different height modules may be inserted into the opening 215 (e.g., two stacked modules or one module as described above with respect to FIG. 7).

The guides 212 may include blocks 238, 240 for receiving fasteners (not shown) for attaching the removable modules to the chassis. In the example shown in FIG. 12, blocks 238 are also located along at least one side 214 of the chassis for receiving a fastener attaching the module to the chassis.

The frame 210 further comprises a guide support member 220 extending between the top and bottom walls (and fixedly connected to at least one of the top wall and the bottom wall) of the chassis for mating with lead screws 222 extending from a back end 235 of the guides 212. As shown in FIG. 13, the configurable guides 212 are assembled (stacked) on one another and attached to the frame 210 (support member 220 of the frame) with the long lead screws 222.

The guide 212 includes a longitudinal groove (opening) 226 for receiving the lead screw 222, with a head 224 of the screw positioned within an opening 229 spaced from a front end 233 of the guide. The lead screw 222 extends longitudinally from a front section 231 of the guide (e.g., front third, front quarter, front half of the guide) to a back end 235 of the guide. The front section of the guide (forward of the opening 229) also includes a longitudinal groove 236 for receiving a tool for use in tightening the lead screw 222 to secure the guide 212 to the chassis 210 or loosening the lead screw for removal of the guide. Since the lead screw 222 is set back from the front end 233 of the guide, no additional space is required at the front of the chassis to accommodate the head 224 of the screw. The term opening as used herein may refer to the opening 229 extending through the guide 212 as shown in FIG. 12 or a groove or channel for receiving the head 224 of the lead screw and allowing for access to rotate the head of the lead screw.

In one or more embodiments, the lead screw 222 is retained within the groove 226 with plates 230, which allow for rotational movement of the lead screw 222 within the groove. The lead screw 222 may be positioned within the groove 226, with the head 224 of the screw positioned within opening 229 and the plates 230 then attached to the guide 212 to hold the lead screw in place. The grooves 226 may be formed on either side of the guide 212. Also, the opening 229 may be spaced any distance from the front end 233 of the guide 212 as long as it is sufficiently close to the front edge to allow for easy access to the head 224 of the lead screw to allow for finger loosening or tightening of the screw 222 to the guide support member 220. In one embodiment, the front section groove 236 also includes a plate 234 for use in guiding a tool (not shown) for proper positioning to access the lead screw head 224. The opening 229 should therefore also be spaced at a distance from the front end 233 that allows for a tool with a reasonable length shaft to reach the head of the screw by passing the tool through groove 236 formed in the front section 231 of the guide 212. The location of the opening 229 also prevents inadvertent loosening of the guide 212 by loosening the screw 222 since the head 224 of the screw is not accessible with modules installed in the chassis.

The guides 212 may be inserted one by one into the chassis 210. Guide pins 221 extending forward from the guide support member 220 fit within corresponding openings (not shown) on each back end 235 of the guides 212 to align the guides within the chassis 210. Once the guides 212 are aligned into the chassis, the lead screw 222 may be tightened using an Allen wrench (hex key) to turn the head of the lead screw in the clockwise direction (FIG. 13). Rotation of the lead screws 222 in the direction shown by arrows located at the head of the lead screw results in linear movement of the guides closer towards the guide support member 220 attached to the frame to pull the guides into position. The lead screw 22 may also be tightened by hand since knurling is provided on the screw head surface to provide an effective grip.

FIGS. 14 and 15 illustrate removal of the guides 212. The lead screw 222 may be loosened to force the guide away from the guide support member 220 and disconnect the guide from the support member thereby allowing the guide to be easily slid out and removed from the chassis 210. The lead screw is untightened (either by hand or using a tool) and the guide is pulled out in the direction shown. FIG. 14 illustrates removal of the lower guide and FIG. 15 illustrates removal of the upper guide. As previously described, each guide may be independently inserted or removed from the guide and the modular electronic system may be configured with only one guide installed (either top or bottom guide) to provide many different configurations of slots for receiving various number or size modules. For example, as shown in FIGS. 6 and 7, only one guide 212 may be installed for receiving two half width modules and one full width module or an L-shaped module.

Figure 16:
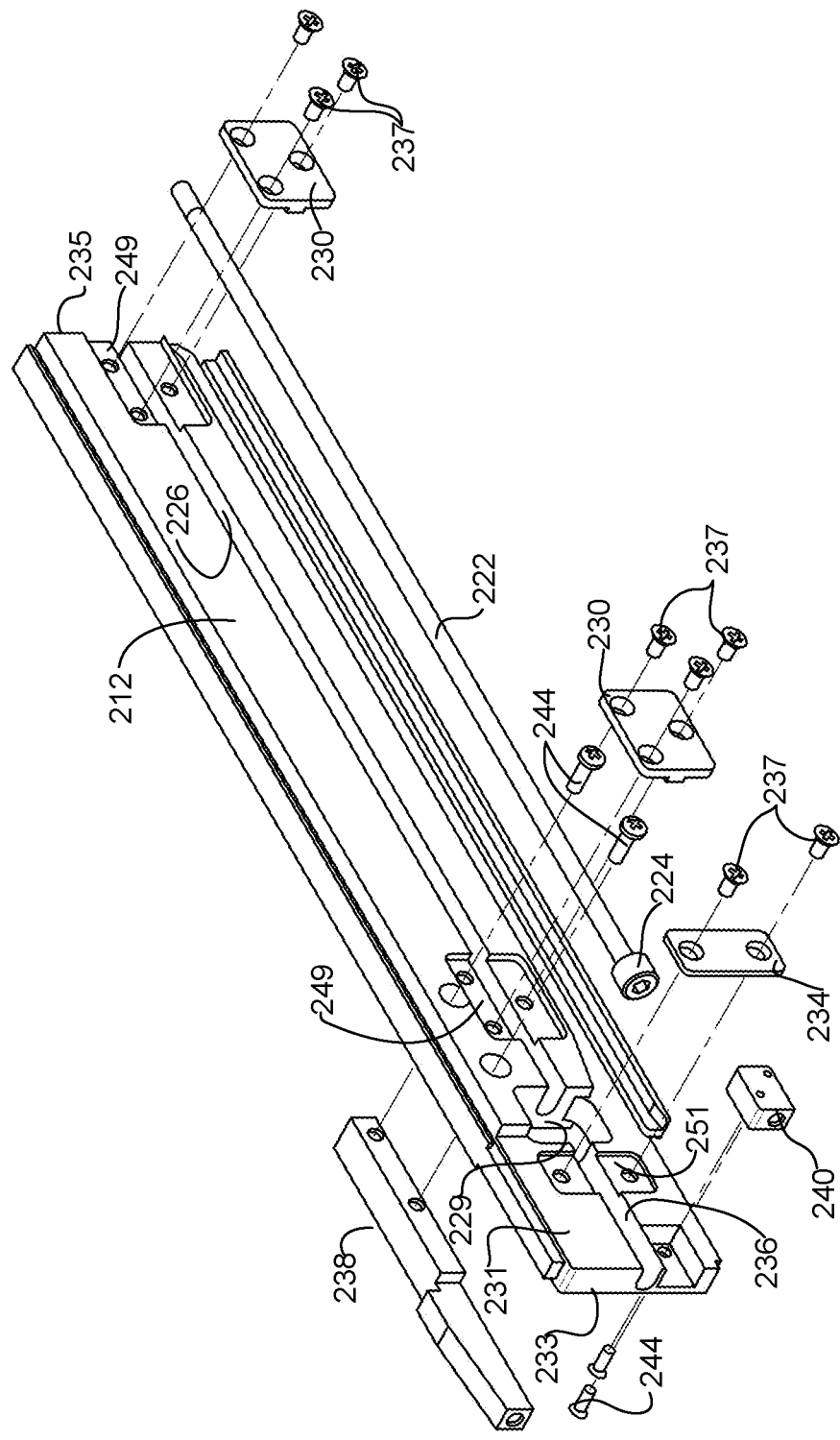
FIG. 16 is an exploded view of one of the guides and lead screw shown in FIG. 12.

FIG. 16 illustrates an exploded view of the guide 212 shown in FIGS. 12-15. As shown in FIG. 16, the longitudinal groove 226 extends along one side of the guide. The opening 229 for receiving the head 224 of the lead screw 222 is located at the front section 231 of the guide 212, spaced from the front edge 233 and easily accessible from a front opening of the chassis for loosening or tightening the screw by hand or a tool may be inserted through the front groove 236 to loosen or tighten the guide for insertion of the lead screw into aligned openings 225 on the guide support member 220 (FIG. 12). The grooves 226, 236 may be located on either side of the guide 212 and may also be formed as a longitudinal opening internal to the guide, in which case the front section of the guide would be configured to allow for insertion of the lead screw through the guide.

Plates 230 are attached to the guide 212 at corresponding recesses 249 formed on one side of the guide 212. Fasteners (e.g., screws) 237 are used to attach the plates 230 to the guide 212. Plate 234 may also be attached to a side of the guide at recess 251 with fasteners 237 to provide a channel guide with groove 236 for receiving a tool to tighten or loosen the lead screw 222, as previously described.

As previously described, one or more blocks 238, 240 comprising openings for receiving fasteners may be attached to the guide 212 for use in securing modules to the chassis. The blocks 238, 240 may be attached to the guide 212 with suitable fasteners 244.

It is to be understood that the modular electronic system and guides shown in FIGS. 12-16 are only examples and that the modular electronic system may comprise a different number or arrangement of guides and different size openings for receiving different types of modules, without departing from the scope of the embodiments. Also, the lead screw and guide support member arrangement shown in FIGS. 12-16 is only an example and variations may be made without departing from the scope of the embodiments. For example, various elements or members may be used to retain the lead screws in place on the guides. Also, the channel shown for receiving a tool and providing access to the lead screw may be different than shown. For example, an internal channel may be drilled into the guide to provide access to the lead screw from a front end of the guide.

As can be observed from the foregoing, the embodiments described herein may provide numerous advantages. For example, one or more embodiments enable flexible modularity by allowing for combinations of different form-factor modules supporting a variety of business applications (switching, routing, transport, computing, security, and others). Since only new modules need to be developed, rather than modules and frame, hardware development investment may be reduced and longer product life cycles may be achieved. One or more embodiments provide increased flexibility for next-generation modules with more PCB (Printed Circuit Board) area and higher density of interconnects. A combination of high and low power modules provides an optimum use of available volume. Irregular shaped form-factors (e.g., L-shaped) provide larger volume for heat sink along with multiple front panel interconnect ports. One or more embodiments offer opportunity for future development of higher performance modules, reduce development time, increase product life cycle, and provide a common hardware system for multiple business segments. By allowing customers to use the same hardware for modules of different functionality, their capital investment may be reduced. One or more embodiments may also provide improved mechanical stability, consistent insertion/extraction forces, and compensation for tolerance variations through the use of a detent mechanism between the guides and frame. Indexing may also be provided to ensure proper alignment between the guides and frame. One or more embodiments may also provide safety features that prevent inadvertent removal of the configurable module guides or modules from being inserted in wrong orientation. Moreover, one or more of the embodiments may provide a lead screw connection of the guides to the frame with easy access to the lead screw without impacting a front profile of the modular electronic system.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
    a frame comprising a top wall, a bottom wall, and sides defining an opening for receiving a plurality of removable electronic modules;
    a guide slidably insertable into the frame to partition an upper or lower portion of the opening when inserted into the frame, wherein the guide comprises a first edge for slidable engagement with the top wall or the bottom wall; and
    a lead screw extending from an opening in the guide spaced from a front end of the guide, to a back end of the guide for connecting the guide to the frame.

2. The apparatus of claim 1 further comprising a guide support member connected to at least one of the bottom wall and the top wall of the frame and comprising an opening for receiving the lead screw.

3. The apparatus of claim 1 wherein the guide comprises a longitudinal groove for receiving the lead screw.

4. The apparatus of claim 3 wherein the guide comprises a plate extending over said groove for retaining the lead screw on the guide while allowing rotation of the lead screw within said groove.

5. The apparatus of claim 1 wherein said opening extends through the guide for receiving a head of the lead screw.

6. The apparatus of claim 5 wherein the guide comprises a groove extending from said front end of the guide to said opening for insertion of a tool to tighten or loosen the lead screw.

7. The apparatus of claim 1 further comprising a second guide comprising a first edge for slidable engagement with the top wall or the bottom wall and a second edge for slidable engagement with the other guide.

8. The apparatus of claim 1 wherein the guide partitions said opening for receiving two of said plurality of removable electronic modules when the guide is inserted into the frame and wherein the guide may be removed from the frame for receiving a larger width electronic module.

9. The apparatus of claim 1 further comprising an L-shaped module inserted into the opening.

10. The apparatus of claim 1 wherein the guide extends longitudinally generally equidistant from the sides of the frame defining said opening.

11. An apparatus comprising:
a frame comprising a top wall, a bottom wall, and sides defining an opening for receiving removable electronic modules;
a guide extending longitudinally in the frame and partitioning at least a portion of said opening, wherein the guide is adjacent to one of the top wall and the bottom wall and spaced from the other of the top wall and the bottom wall; and
a lead screw extending longitudinally within a groove formed in a side of the guide for attaching the guide to a guide support member connected to at least one of the top wall and the bottom wall.

12. The apparatus of claim 11 wherein the guide comprises an opening spaced from a front end of the guide for receiving a head of the lead screw.

13. The apparatus of claim 12 wherein the guide comprises a groove extending from said front end of the guide to said opening for insertion of a tool to tighten or loosen the lead screw.

14. The apparatus of claim 11 further comprising a second guide, wherein the guides are stacked on one another.

15. The apparatus of claim 11 wherein the guide partitions said opening for receiving at least two of said plurality of removable electronic modules when the guide is inserted into the frame and wherein the guide may be removed from the frame for receiving a larger width electronic module.

16. The apparatus of claim 11 wherein the guide support member extends between the top wall and the bottom wall and comprises an opening for receiving the lead screw.

17. A modular electronic system comprising:
a frame comprising a top wall, a bottom wall, and sides defining an opening for receiving a plurality of removable electronic modules;
at least two guides extending generally parallel with the sides of the frame, each of the guides comprising an edge for slidable engagement with another of said at least two guides; and
at least two lead screws for connecting the guides to the frame;
wherein the guides partition said opening for receiving said plurality of removable electronic modules and wherein the guides are removable to configure said opening for receiving a different number of the removable electronic modules or different sizes of the removable electronic modules.

18. The modular electronic system of claim 17 wherein each of the guides comprises an opening spaced from a front end of the guide and a longitudinal groove along one side of the guide, wherein the lead screw is positioned within said groove with a head of the lead screw positioned within said opening.

19. The modular electronic system of claim 17 wherein said at least two guides comprises two guides dividing said opening into two openings, each of said openings configured to receive one line card or two line cards having a height generally half of the height of the one line card, each of the line cards comprising the same width.

20. The modular electronic system of claim 17 wherein said at least two removable guides each comprises a first edge for slidable engagement with the top wall or the bottom wall and a second edge for slidable engagement with another of said at least two guides.

* * * * *